United States Patent
Lee et al.

[11] Patent Number: 6,010,940
[45] Date of Patent: *Jan. 4, 2000

[54] METHODS FOR FABRICATING CVD TIN BARRIER LAYERS FOR CAPACITOR STRUCTURES

[75] Inventors: Myoung-bum Lee; Hyeon-deok Lee, both of Seoul, Rep. of Korea

[73] Assignee: Samsung Electronics Co., Ltd., Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/935,464

[22] Filed: Sep. 24, 1997

[30] Foreign Application Priority Data

Nov. 29, 1996 [KR] Rep. of Korea ................... 96-59840

[51] Int. Cl.[7] .................................................. C23C 16/34
[52] U.S. Cl. .................. 438/396; 438/399; 438/381; 427/80; 427/255.391; 427/255.394; 427/376.6; 427/377
[58] Field of Search ............... 427/79, 80, 255.2, 427/255.7, 376.6, 377, 255.391, 255.394; 438/396, 399, 381

[56] References Cited

U.S. PATENT DOCUMENTS

| 4,897,709 | 1/1990 | Yokoyama et al. | 357/68 |
|---|---|---|---|
| 5,279,857 | 1/1994 | Eichman et al. | 427/255 |
| 5,414,655 | 5/1995 | Ozaki et al. | 365/149 |
| 5,612,558 | 3/1997 | Harshfield | 257/298 |

OTHER PUBLICATIONS

Kwon et al., IEDM Technical Digest 93, pp. 53–56 (no month), 1993.
Lee et al., IEDM Technical Digest, pp. 683–686, Dec. 1996.
Hillman, J.T., et al., Comparison of Titanium Nitride Barrier Layers Produced by inorganic and Organic CVD, VMIC Conference Jun. 9–10, 1992 pp. 246–252.
Choi, Siyoung, et al., Thermal Stability of TiN Diffusion Barrier Under High Thermal Stress in W–Plug Common Contact, *Advanced Metallization and Interconnection Systems for ULSI Applications in 1996*, pp. 313–318 (1996) (no month).

*Primary Examiner*—Timothy Meeks
*Attorney, Agent, or Firm*—Myers Bigel Sibley & Sajovec

[57] ABSTRACT

A method of fabricating a capacitor for a integrated circuit device includes the steps of forming a lower capacitor electrode on an integrated circuit substrate, and forming a dielectric layer on the lower capacitor electrode opposite the integrated circuit substrate. A titanium nitride barrier layer is deposited by chemical vapor deposition on the dielectric layer opposite the integrated circuit substrate to a thickness in the range of 50 Å to 500 Å using $TiCl_4$ as a source gas. The titanium nitride barrier layer is annealed, and an upper electrode is formed on the titanium nitride barrier layer opposite the integrated circuit substrate.

5 Claims, 4 Drawing Sheets

(a):$N_2$ IN-SITU ANNEALING
(b):$NH_3$ IN-SITU ANNEALING (a): N₂ IN-SITU ANNEALING
(b): NH₃ IN-SITU ANNEALING (a): N₂ IN-SITU ANNEALING
(b): NH₃ IN-SITU ANNEALING

METHODS FOR FABRICATING CVD TIN BARRIER LAYERS FOR CAPACITOR STRUCTURES

FIELD OF THE INVENTION

The present invention relates to the field of integrated circuits and more particularly to methods of forming barrier layers for capacitor structures.

BACKGROUND OF THE INVENTION

As integrated circuit memory devices such as dynamic random access memory (DRAM) devices have become more highly integrated, the space available for memory cell capacitors has been reduced. Accordingly, there is a need to provide a capacitor on a smaller area while maintaining a predetermined capacitance. In response to this need, materials having relatively high dielectric constants have been used to provide capacitor dielectric layers thereby increasing capacitances. In particular, tantalum pentoxide ($Ta_2O_5$) layers have been used, and tantalum pentoxide has good step coverage on complicated lower electrode structures.

When using a material having a high dielectric constant such as tantalum pentoxide to provide a capacitor dielectric layer together with a polysilicon capacitor upper electrode, however, a barrier layer may be needed to reduce reactions between the polysilicon electrode and the tantalum pentoxide dielectric layer. Titanium nitride (TiN) layers formed using physical vapor deposition (PVD) have been used to provide a barrier layer between polysilicon electrodes and tantalum pentoxide dielectric layers. A PVD TiN barrier layer, however, may not provide a sufficiently uniform thickness when used with capacitors having complicated structures such as cylindrical structures, multiple fin structures, or stacked hemispherical grain (HSG) structures. As will be understood by one having skill in the art, a barrier layer generally requires a uniform thickness across even and uneven portions of a dielectric layer. A PVD TiN barrier layer may thus be unsuitable for use with more complicated capacitor structures.

TiN layers formed using chemical vapor deposition have been used to separate silicon substrates and aluminum layers. According to this method, however, the resistance of the TiN layer may be increased due to the chlorine (Cl) in the titanium tetrachloride ($TiCl_4$) used as the source gas. In particular, this chlorine may remain in the TiN layer after the deposition thereof thereby increasing the resistance of the TiN layer.

A method for removing the Chlorine (Cl) from the TiN layer has been discussed in U.S. Pat. No. 5,279,857, the disclosure of which is hereby incorporated herein in its entirety by reference. As discussed in this patent, a TiN layer is formed using a low pressure chemical vapor deposition (LPCVD) process, and the TiN layer is then annealed in an atmosphere of $NH_3$ gas. More particularly, the TiN layer is formed on a silicon substrate using $TiCl_4$, and then the Chlorine in the TiN layer is reduced through a post annealing process in an atmosphere of $NH_3$ gas, thereby reducing the sheet resistance of the TiN layer.

SUMMARY OF THE INVENTION

It is therefor an object of the present invention to provide improved method for forming integrated circuit capacitors.

It is another object of the present invention to provide improved methods for forming barrier layers for integrated circuit capacitors.

These and other objects are provided according to the present invention by methods including the steps of chemical vapor depositing a titanium nitride barrier layer on a dielectric layer to a thickness in the range of 50 Å to 500 Å using $TiCl_4$ as a source gas, and annealing the titanium nitride barrier layer. By using chemical vapor deposition to form the TiN barrier layer within the range of thicknesses discussed above, the reaction between the $TiCl_4$ source gas and the dielectric layer can be reduced thereby reducing the thickness of any $TiO_x$ layer at an interface between the dielectric layer and the TiN layer and also reducing the equivalent oxide layer thickness. In addition, Chlorine in the TiN barrier layer can be more effectively removed thereby reducing leakage currents.

The inventor has found that when a TiN layer is formed on a dielectric layer using a chemical vapor deposition (CVD) method with $TiCl_4$ gas as a source, chlorine (Cl) may remain in the TiN layer thereby increasing the leakage current and increasing the equivalent oxide layer thickness. The $TiCl_4$ source gas used in the chemical vapor deposition may react with the dielectric layer thereby forming an oxide layer at an interface between the dielectric layer and the TiN layer. This oxide layer may increase the equivalent oxide layer thickness. In addition, after the CVD TiN layer is formed, chlorine (Cl) may remain in the TiN layer after the deposition thereof in the form of $TiCl_x$. This $TiCl_x$ may react with the $Ta_2O_5$ thereby forming $TiO_x$ at the interface between the dielectric layer and the TiN layer.

The methods of the present invention can thus be used to provide capacitors for integrated circuit devices. In particular, a method of fabricating a capacitor includes the steps of forming a lower capacitor electrode on an integrated circuit substrate, and forming a dielectric layer on the lower capacitor electrode opposite the integrated circuit substrate. A titanium nitride barrier layer is chemical vapor deposited on the dielectric layer opposite the integrated circuit substrate to a thickness in the range of 50 Å to 500 Å using $TiCl_4$ as a source gas. The titanium nitride barrier layer is then annealed, and an upper electrode is formed on the titanium nitride barrier layer opposite the integrated circuit substrate.

The dielectric layer can be a $Ta_2O_5$ layer, and the barrier layer can have a thickness in the range of 100 Å to 300 Å. In addition, the annealing step can be performed in atmosphere of $NH_3$ gas thereby reducing chlorine in the titanium nitride barrier layer. In particular, the chlorine may be removed in the form of hydrogen chloride gas. Moreover, the chemical vapor depositing step and the annealing step can be performed in a common reaction chamber thereby reducing the process time and handling requirements. In other words, the chemical vapor depositing step and the annealing step can be performed in-situ.

The chemical vapor depositing step can be performed using a low pressure chemical vapor deposition (LPCVD) system, a plasma enhanced chemical vapor deposition (PECVD) system, or an electron cyclotron resonance chemical vapor deposition (ECRCVD) system. In addition, the lower capacitor electrode can have a stack structure, a cylindrical structure, a multiple fin structure, or a hemispherical grain (HSG) structure.

By using the methods of the present invention, improved capacitors can thus be provided for integrated circuit devices. Moreover, a desired capacitance can be provided in a highly integrated circuit device.

DESCRIPTION OF THE PREFERRED EMBODIMENT

Figure 1:
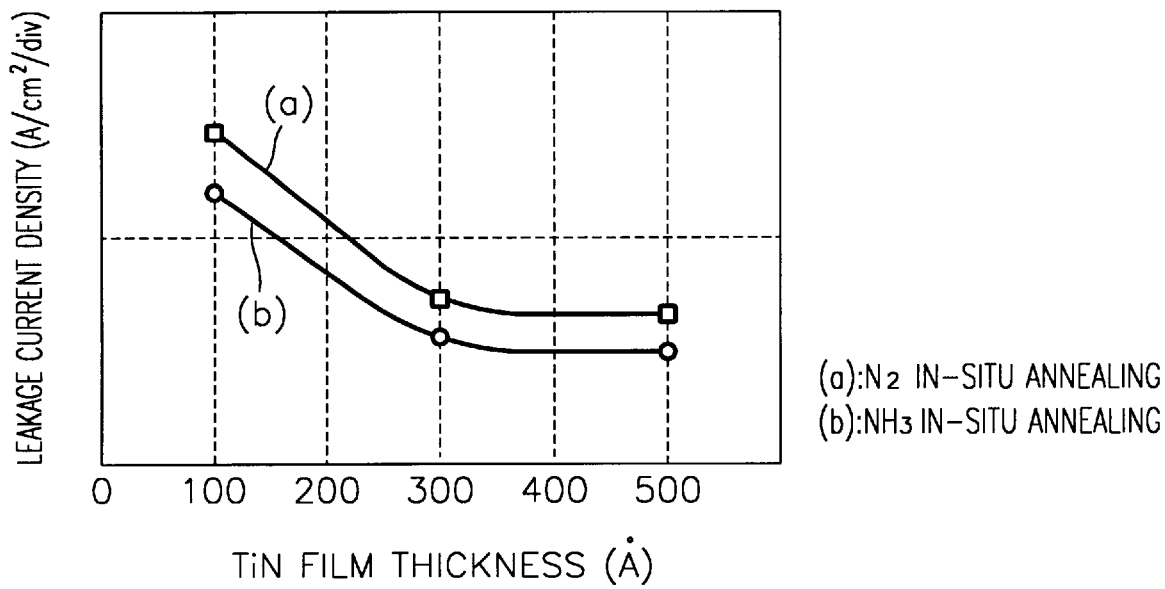
FIG. 1 is a graph illustrating leakage current densities as a function of a thickness of a TiN barrier layer for capacitors formed according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

The inventor has found that capacitor dielectric characteristics, such as leakage currents and equivalent oxide layer thicknesses, are influenced by the thickness of a TiN barrier layer formed by chemical vapor deposition (CVD). In particular, when $TiCl_4$ is used as a source gas when forming a TiN layer by chemical vapor deposition, the $TiCl_4$ may react with oxygen in a dielectric layer such as a $Ta_2O_5$ layer, thereby forming a $TiO_x$ layer at the interface between the $Ta_2O_5$ layer and the TiN layer. This $TiO_x$ layer may cause an increase in the equivalent oxide layer thickness reducing capacitance. It is thus preferable that the thickness of the $TiO_x$ layer is reduced. In addition, Chlorine in the CVD TiN layer may generate $TiCl_x$ which may react with TaO thereby forming an oxide layer such as $TiO_x$, and Chlorine remaining in the barrier layer may increase the leakage current density. It is thus preferred to reduce Cl in the CVD TiN layer.

It has been found by the inventor that a thickness of the $TiO_x$ layer increases as the deposition time of the TiN layer and the thickness of the TiN layer increase. It has also been found that the thickness of the $TiO_x$ layer can be reduced when the thickness of the TiN layer was in the range of 50 Å to 500 Å. It has also been found that when the thickness of the TiN layer is in the range of 50 Å to 500 Å, Chlorine in the TiN barrier layer can be more effectively removed.

According to an embodiment of the present invention, the TiN barrier layer is formed on a capacitor dielectric layer to have a thickness in the range of 50 Å to 500 Å, and preferably to have a thickness in the range of 100 Å to 300 Å. Barrier layers formed according to the present invention will now be described with reference to graphs illustrating experimental result as follows. In particular, FIGS. 1 through 4 illustrate experimental results of samples fabricated according to the present invention wherein leakage current density, equivalent oxide layer thickness, and Chlorine content in the TiN barrier layer are plotted as a function of the thickness of the CVD TiN layer.

Figure 2:
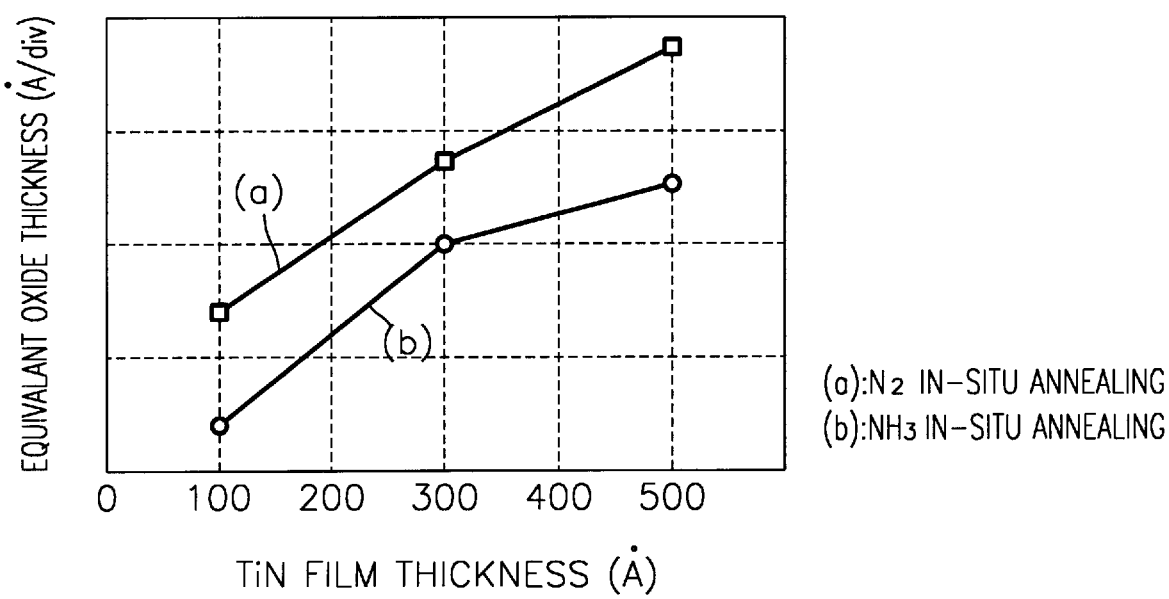
FIG. 2 is a graph illustrating equivalent oxide layer thicknesses of a capacitor as a function of a thickness of a TiN barrier layer for capacitors formed according to the present invention.

For FIGS. 1 and 2, doped polysilicon was deposited to a thickness of approximately 8000 Å to form lower capacitor electrodes, and layers of $Ta_2O_5$ were deposited on the lower capacitor electrodes to a thickness of approximately 120 Å to provide capacitor dielectric layers. TiN layers having respective thicknesses of 100 Å, 300 Å, and 500 Å, were then chemical vapor deposited on the capacitor dielectric layers using $TiCl_4$ and $NH_3$ on each of the $Ta_2O_5$ dielectric layers. The leakage current densities and the equivalent oxide layer thicknesses were measured at a reference voltage of 1.5V. The curve a indicates samples where the CVD TiN layers were formed and then annealed in an atmosphere of nitrogen gas (nitrogen annealing). The curve b indicates samples where the CVD TiN layers were annealed in an atmosphere of $NH_3$ gas ($NH_3$ annealing).

As shown in FIG. 1, the leakage current density is reduced as the TiN layer thickness increases. With TiN layer thicknesses greater than 300 Å, however, there is relatively little change in the leakage current density. In addition, the leakage current densities for capacitors formed using the nitrogen anneal a was higher than that for capacitors formed using the $NH_3$ anneal b.

As shown in FIG. 2, the equivalent oxide layer thickness increases as the TiN layer thickness increases. This relationship may be due to a reaction between the $TiCl_4$ and the $Ta_2O_5$ dielectric layer thereby forming $TiO_x$ at the interface between the TiN barrier layer and the $Ta_2O_5$ dielectric layer when forming the TiN barrier layer. In addition, the equivalent oxide layer thickness was thicker for capacitors formed using the nitrogen anneal a than for capacitors formed using the $NH_3$ anneal b. This may be because the remaining chlorine content in the TiN layer when using a nitrogen anneal is higher than the remaining chlorine content when using an $NH_3$ anneal. Accordingly, less chlorine may be available as $TiCl_x$ to react with the $Ta_2O_5$ dielectric layer to form $TiO_x$ at the interface between the barrier and dielectric layers.

As a result, in the case that the TiN barrier layer is 500 Å thick, for example, the leakage current density for capacitors formed using the $NH_3$ anneal b was lower than that for capacitors formed using the nitrogen anneal a even though the equivalent oxide layer thickness for capacitors formed using the $NH_3$ anneal b was less than that for capacitors formed using the nitrogen anneal a. This result is contrary to the conventional wisdom that as the equivalent oxide layer thickness increases, the leakage current density decreases. This result seems to occur because chlorine is more effectively removed from the TiN barrier layer through an $NH_3$ anneal, thereby lessening the chlorine content remaining in the TiN layer.

Figure 3:
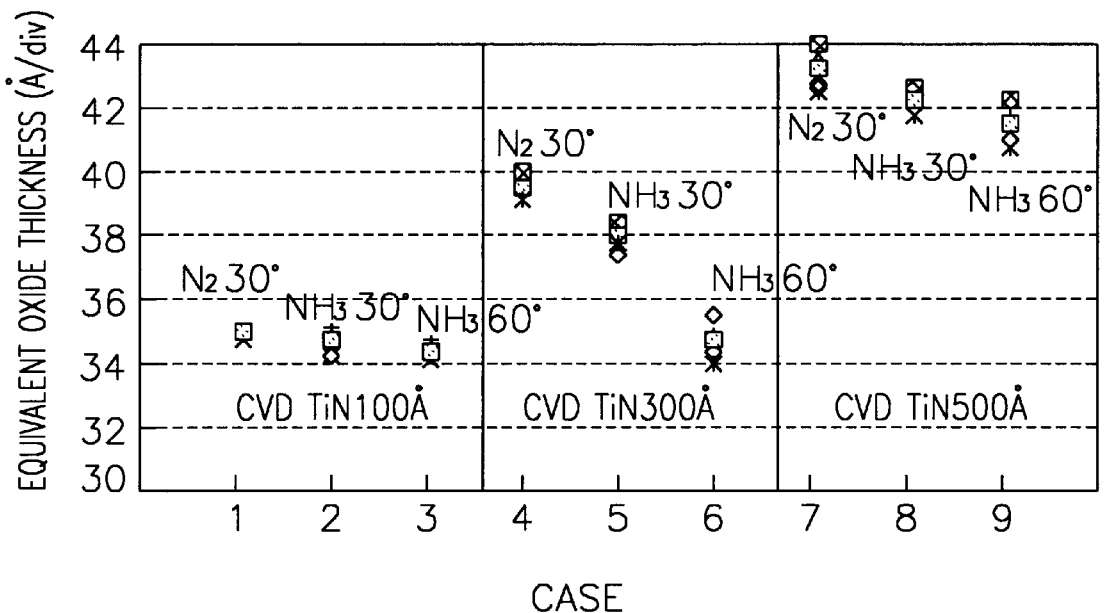
FIG. 3 is a plot illustrating a comparison of equivalent oxide layer thicknesses vs. thicknesses of a TiN barrier layer and annealing times for capacitors formed according to the present invention.

FIG. 3 shows results obtained by measuring each equivalent oxide layer thickness after performing $NH_3$ annealing steps for 30 seconds and 60 seconds on samples in which the $Ta_2O_5$ dielectric layers were 120 Å thick and the TiN barrier layers were 100 Å, 300 Å or 500 Å thick. For purposes of comparison, samples with the same thicknesses of layers were annealed using nitrogen for 30 seconds. Five samples of each TiN layer thickness were measured.

As shown in FIG. 3, the equivalent oxide layer thickness increases as the thickness of the TiN barrier layer increases. It has been known that when the equivalent oxide layer thickness in the 100 Å TiN layer was compared with that in the 500 Å TiN layer, the equivalent oxide layer thickness in the 500 Å TiN layer was much greater given the same annealing time conditions. As discussed above, this result may be because as the TiN layer was thicker, more $TiO_x$ may be formed at the interface between the TiN layer and the $Ta_2O_5$ layer. For example, when the thickness of the TiN layer was 300 Å, as annealing time is lengthened, the thickness of the equivalent oxide layer is reduced for longer anneal times. That is, the equivalent oxide layer thickness obtained after annealing for 60 seconds is less than that obtained after annealing for 30 seconds. It seems that this result occurs because chlorine was removed from the CVD TiN layer through annealing, thereby constraining the interface reaction.

Figure 4:
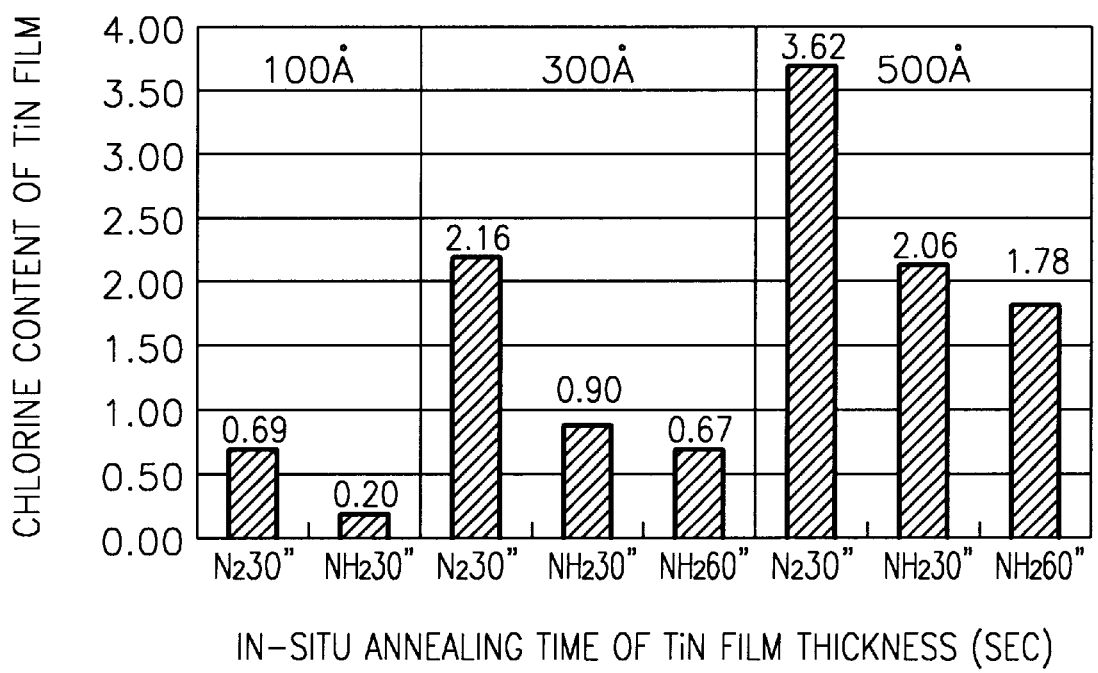
FIG. 4 is a graph obtained using thermal deposition spectroscopy (TDS) illustrating a comparison of the Chlorine content of a TiN barrier layer vs. thicknesses of the TiN barrier layer for different annealing times.

FIG. 4 illustrates the chlorine content in TiN barrier layers as a function of $NH_3$ anneal time for various TiN layer thicknesses. The chlorine content (Y-axis) in the TiN barrier layer designates relative evaluation. As shown in FIG. 4, the chlorine content increases as the TiN layer thickness increases when using the same anneal time. Furthermore, the chlorine content decreases as the anneal time increases for the same TiN barrier layer thickness. In the case where the thickness of the TiN barrier layer was 500 Å and $NH_3$ anneal was performed for 30 seconds, the chlorine content was more than 5 times that of the case where the TiN barrier layer was 100 Å.

When the TiN layer was 500 Å thick and the anneal was performed for 60 seconds, the chlorine content was greater than that when the TiN layer was 300 Å thick and the anneal was performed for 30 seconds. When the TiN layer was 500 Å thick, the chlorine content after the annealing was performed for 30 seconds was similar to that when the TiN layer was 300 Å thick and the anneal was not performed.

Figure 5:
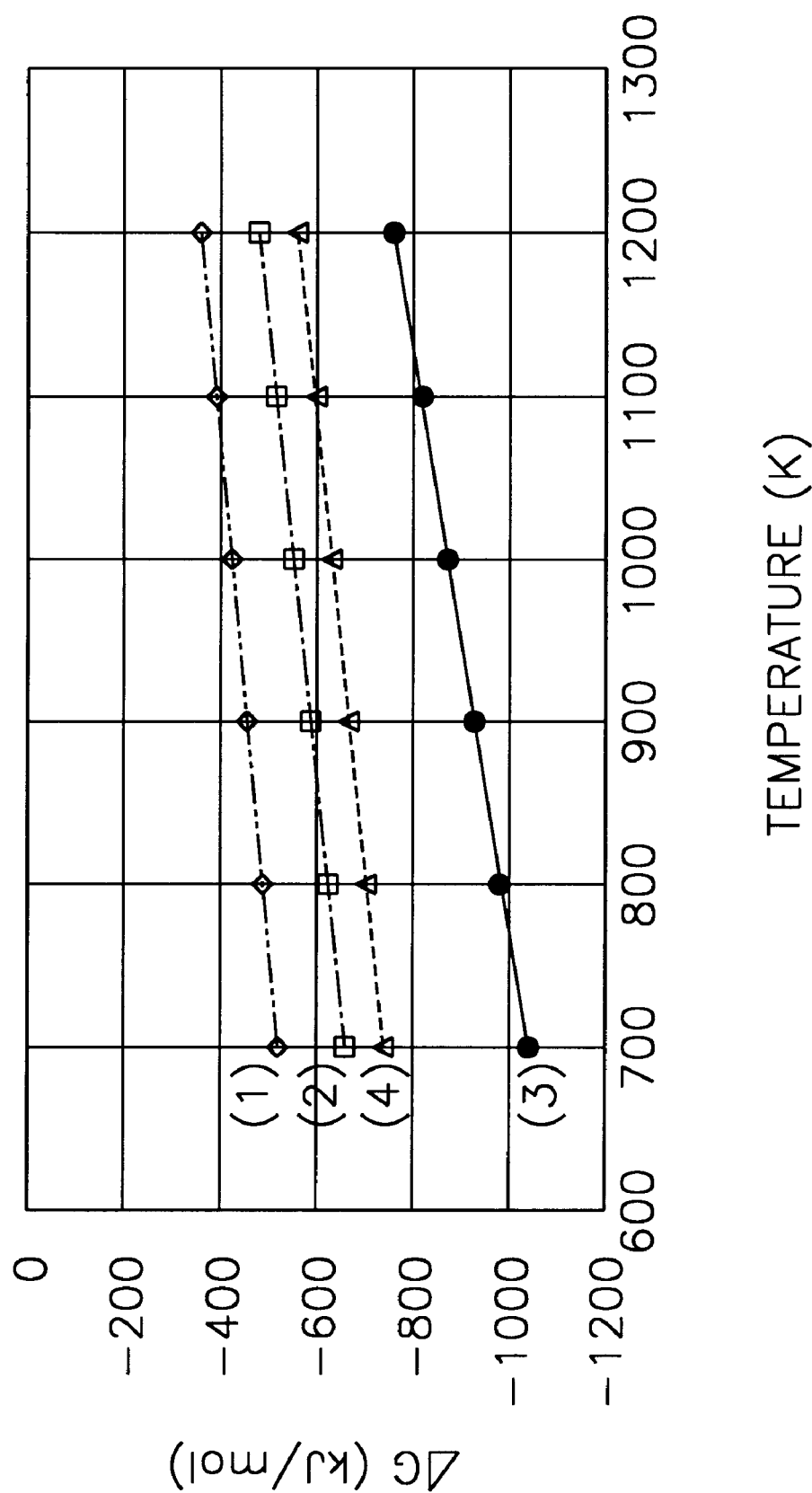
FIG. 5 is a graph illustrating thermodynamic reactivity of $TiCl_x$ remaining in a TiN layer with $Ta_2O_5$ for capacitors formed according to the present invention.

FIG. 5 is a graph illustrating the thermodynamic reactivity of Chlorine remaining as $TiCl_x$ in a CVD-TiN layer with a $Ta_2O_5$ dielectric layer. Here, the x-axis indicates reaction temperature, the y-axis indicates Gibbs free energy, and plots (1), (2), (3), and (4) indicate each Gibbs free energy curve with respect to the cases that Chlorine remaining in the TiN layer becomes 5TiCl, (5/2)TiCl, (5/10)TiCl, and 3TiCl, respectively.

In general, it is understood that the Gibbs free energy has a negative value, and that the larger the absolute value of the Gibbs free energy is, the greater the reactivity becomes. As can be seen from FIG. 5, the thermodynamic reactivity of $Ta_2O_5$ with $TiCl_x$ is high. Also, the lower the temperature is, the higher the reactivity becomes. The respective reaction will be described as follows;

(1) $Ta_2O_5 + 5\ TiCl \rightarrow TiO + 2\ Ta + (5/2)\ Cl_2$
(2) $Ta_2O_5 + (5/2)\ TiCl \rightarrow (5/2)\ TiO_2 + 2\ Ta + (5/4)\ Cl_2$
(3) $Ta_2O_5 + (5/10)\ TiCl \rightarrow (5/3)\ Ti_2O_3 + 2\ Ta + (5/3)\ Cl_2$
(4) $Ta_2O_5 + 3\ TiCl \rightarrow Ti_3O_5 + 2\ Ta + (3/2)\ Cl_2$ As described above, the $TiO_x$ formed by the reaction of $TiCl_x$ with $Ta_2O_5$ increases the equivalent oxide layer thickness, and the surplus Chlorine increases the leakage current density.

According to the experimental results illustrated in FIGS. 1 through 5, as the TiN layer became thicker, the equivalent oxide layer thickness increased, and more chlorine remained in the TiN layer as the TiN layer thickness increased. Accordingly, if the TiN layer thickness is maintained within a predetermined range such as 50 Å to 500 Å, and if the TiN layer is annealed using $NH_3$, the chlorine content in the TiN layer can be reduced so that the equivalent oxide layer thickness of a capacitor dielectric layer can be reduced and the leakage current density can be reduced.

Here, a minimum thickness of the TiN layer may be set to approximately 50 Å, which is sufficient to allow the TiN layer to serve as a barrier layer, and to reduce reaction of the polysilicon layer with the $Ta_2O_5$ dielectric layer. In addition, a maximum thickness of the TiN layer may be set to approximately 500 Å, which is a level sufficient to obtain the equivalent oxide layer thickness capable of securing an appropriate capacitance value, and to appropriately decrease the leakage current density by significantly reducing Cl in the layer.

Figure 6:
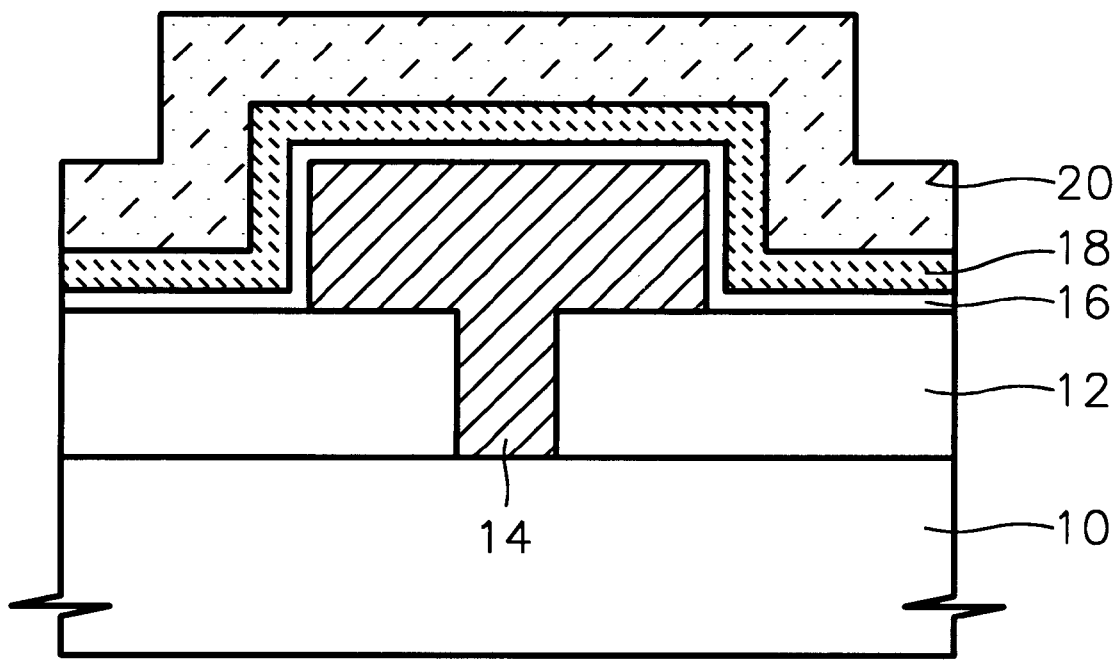
FIG. 6 is a cross sectional view illustrating a capacitor formed according to a method of the present invention.

Referring to FIG. 6, a capacitor fabricated according to an embodiment of the present invention will be described. An interlayer dielectric layer 12 is formed on a semiconductor substrate 10 where a sub-structure such as a transistor, is formed. In particular, a memory cell access transistor for a dynamic random access memory (DRAM) device cell can be formed in the semiconductor substrate. The interlayer dielectric layer 12 is then patterned to form a contact hole therein exposing part of the semiconductor substrate 10. For example, the contact hole can expose a source/drain region of a memory cell access transistor.

A layer of a conductive material such as doped polysilicon is deposited on the surface of the interlayer dielectric layer and in the contact hole, and this conductive layer is patterned to form a lower capacitor electrode 14. A material such as $Ta_2O_5$ having a relatively high dielectric constant is deposited on the lower capacitor electrode 14 and on the interlayer dielectric layer to a thickness of approximately 120 Å thereby forming dielectric layer 16.

A TiN barrier layer 18 is formed using a chemical vapor deposition (CVD) with $TiCl_4$ and $NH_3$ as source gases. In particular, this TiN barrier layer is preferably deposited to a thickness in the range of 50 Å to 500 Å, and most preferably in the range of 100 Å to 300 Å.

The structure including the TiN barrier layer is then in-situ annealed for a predetermined time, for example, 30 seconds to 60 seconds. The anneal step and the step of depositing the TiN barrier layer are preferably performed in the same chamber. The annealing step is preferably performed in atmosphere of $NH_3$, so that chlorine in the TiN barrier layer reacts with hydrogen and is volatilized as hydrogen chloride (HCl). A layer of a conductive material such as doped polysilicon is then deposited on the TiN barrier layer 18, and this conductive layer can be patterned to provide an upper capacitor electrode 20.

As shown in FIG. 6, the lower capacitor electrode 14 can have a stack structure. TiN barrier layers formed according to the present invention, however, can also be used with lower capacitor electrodes having more complicated structures such as cylindrical structures, multiple fin structures, or stack structures with hemispherical grains (HSG).

According to the present invention, since the barrier layer can be formed through a CVD process, the dielectric layer can be formed from material such as tantalum oxide having a relatively high dielectric constant. At the same time, the lower electrode having a complicated structure can be employed thereby increasing capacitance. Also, the thickness of the TiN barrier layer is formed within a predetermined range, thereby reducing the equivalent oxide layer thickness of a capacitor dielectric layer. The chlorine content in the TiN barrier layer can also be reduced thereby reducing the leakage current density.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating a capacitor for an integrated circuit device, said method comprising the steps of:

forming a lower capacitor electrode on an integrated circuit substrate;

forming a $Ta_2O_5$ capacitor dielectric layer on said lower capacitor electrode opposite said integrated circuit substrate;

chemical vapor depositing a titanium nitride barrier layer on said $Ta_2O_5$ capacitor dielectric layer opposite said lower capacitor electrode to a thickness in the range of 50 Å to 500 Å using $TiCl_4$ as a source gas to reduce formation of $TiO_x$ at an interface between said $Ta_2O_5$ capacitor dielectric layer and said titanium nitride barrier layer as a result of reaction of said $TiCl_4$ with said $Ta_2O_5$ capacitor dielectric layer, thereby reducing an equivalent oxide thickness of a resulting capacitor;

annealing said chemical vapor deposited titanium nitride barrier layer in an atmosphere of $NH_3$ gas to reduce a leakage current density of the resulting capacitor; and forming an upper capacitor electrode on said annealed chemical vapor deposited titanium nitride barrier layer opposite said integrated circuit substrate.

2. A method according to claim 1 wherein said barrier layer has a thickness in the range of 100 Å to 300 Å.

3. A method according to claim 1 wherein said lower capacitor electrode has a structure selected from the group consisting of a stack structure, a cylindrical structure, a multiple fin structure, and a hemispherical grain (HSG) structure.

4. A method according to claim 1 wherein said upper capacitor electrode comprises a polysilicon layer.

5. A method of fabricating a capacitor for an integrated circuit device, said method comprising the steps of:

forming a lower capacitor electrode having a hemispherical grain (HSG) structure on an integrated circuit substrate;

forming a $Ta_2O_5$ capacitor dielectric layer on said lower capacitor electrode opposite said integrated circuit substrate;

chemical vapor depositing a titanium nitride barrier layer on said $Ta_2O_5$ capacitor dielectric layer opposite said lower capacitor electrode to a thickness in the range of 50 Å to 500 Å using $TiCl_4$ as a source gas so as to reduce forming of $TiO_x$ at an interface between said $Ta_2O_5$ capacitor dielectric layer and said titanium nitride barrier layer as a result of reaction of said $TiCl_4$ with said $Ta_2O_5$ capacitor dielectric layer, thereby reducing an equivalent oxide thickness of a resulting capacitor;

annealing said chemical vapor deposited titanium nitride barrier layer in an atmosphere of $NH_3$ gas to reduce a leakage current density of the resulting capacitor; and forming an upper capacitor electrode on said annealed chemical vapor deposited titanium nitride barrier layer opposite said integrated circuit substrate.

* * * * *